United States Patent
Hong

(10) Patent No.: US 10,930,356 B2
(45) Date of Patent: Feb. 23, 2021

(54) MEMORY CONTROLLER AND METHOD OF OPERATING THE SAME

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/673,646

(22) Filed: Nov. 4, 2019

(65) Prior Publication Data
US 2020/0350023 A1   Nov. 5, 2020

(30) Foreign Application Priority Data

May 2, 2019   (KR) ........................ 10-2019-0051786

(51) Int. Cl.
| | |
|---|---|
| *G11C 16/26* | (2006.01) |
| *G06F 11/10* | (2006.01) |
| *G11C 16/04* | (2006.01) |
| *G06F 3/06* | (2006.01) |
| *G11C 11/56* | (2006.01) |

(52) U.S. Cl.
CPC ............ *G11C 16/26* (2013.01); *G06F 3/0604* (2013.01); *G06F 3/0659* (2013.01); *G06F 3/0679* (2013.01); *G06F 11/1068* (2013.01); *G11C 16/0483* (2013.01); *G11C 11/5671* (2013.01)

(58) Field of Classification Search
CPC . G11C 16/26; G11C 16/0483; G11C 11/5671; G06F 3/0604; G06F 3/0659; G06F 3/0679; G06F 11/1068
USPC ....... 714/764, 763, 768, 769, 773, 718, 719; 365/185.09, 200, 201
See application file for complete search history.

(56) References Cited

U.S. PATENT DOCUMENTS

| | | | |
|---|---|---|---|
| 10,636,490 B1 * | 4/2020 | Lin ........................ | G11C 16/26 |
| 10,685,711 B1 * | 6/2020 | Lin ..................... | G11C 11/5642 |
| 2005/0078519 A1 * | 4/2005 | Shiga ................. | G11C 16/3454 |
| | | | 365/185.17 |
| 2012/0236638 A1 * | 9/2012 | Weingarten .......... | G11C 16/349 |
| | | | 365/185.2 |

(Continued)

FOREIGN PATENT DOCUMENTS

| | | |
|---|---|---|
| KR | 10-2010-0127406 | 12/2010 |
| KR | 10-2012-0069108 | 6/2012 |

OTHER PUBLICATIONS

Peleato et al., Adaptive Read Thresholds for NAND Flash, Sep. 2015, IEEE, vol. 63, No. 9, pp. 3069-3081. (Year: 2015).*

*Primary Examiner* — John J Tabone, Jr.
(74) *Attorney, Agent, or Firm* — IP & T Group LLP

(57) ABSTRACT

The memory controller may include a command generator generating and outputting first and second read commands to a memory device so that respective first and second read operations are performed using a first read voltage, a calculator receiving first and second read data in response to the read commands, comparing the first and second read data each other, and calculating a number of first inverted cells and a number of second inverted cells based on a result of the comparing, each of the first inverted cells having a bit value that inverted from a first bit value to a second bit value, and each of the second inverted cells having a bit value that inverted from the second bit value to the first bit value, and a read voltage determiner changing the first read voltage depending on the number of first inverted cells and the number of second inverted cells.

19 Claims, 14 Drawing Sheets

(56) References Cited

U.S. PATENT DOCUMENTS

| | | | |
|---|---|---|---|
| 2016/0005495 A1* | 1/2016 | Lasser | G06F 12/0246 |
| | | | 711/103 |
| 2018/0122483 A1* | 5/2018 | Yang | G11C 16/3431 |
| 2019/0050286 A1* | 2/2019 | Lee | G11C 16/26 |
| 2019/0139614 A1* | 5/2019 | Harada | G06F 11/1048 |
| 2019/0295659 A1* | 9/2019 | Hong | G06F 11/1012 |
| 2020/0042245 A1* | 2/2020 | Lee | G11C 11/5642 |

* cited by examiner

FIG. 8
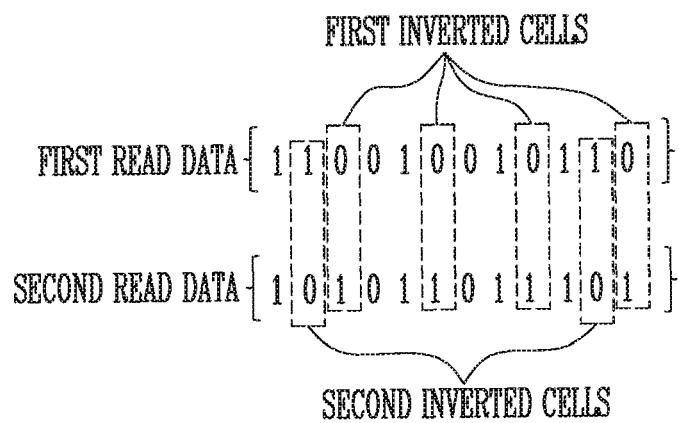
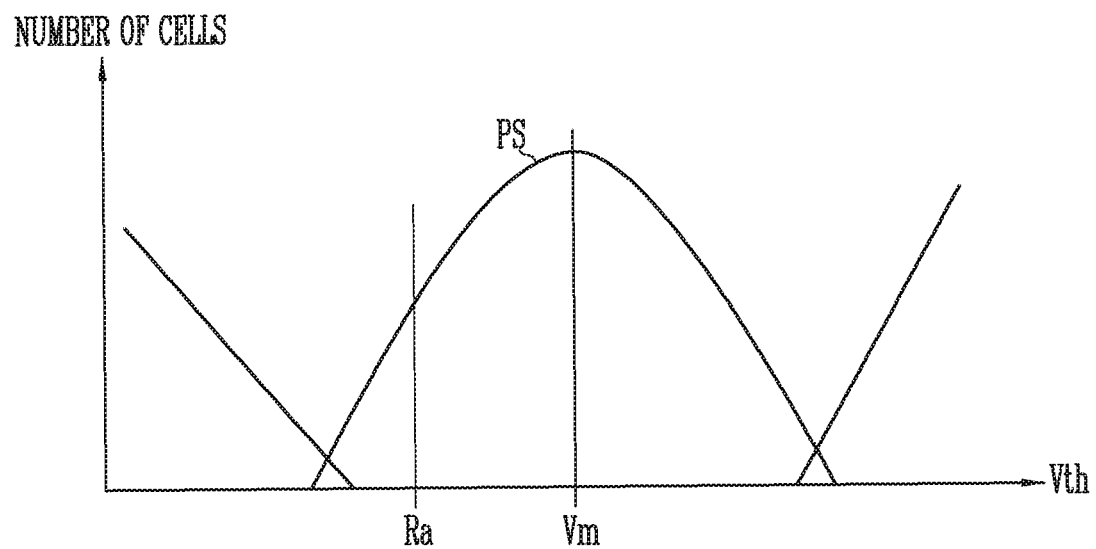

FIG. 9
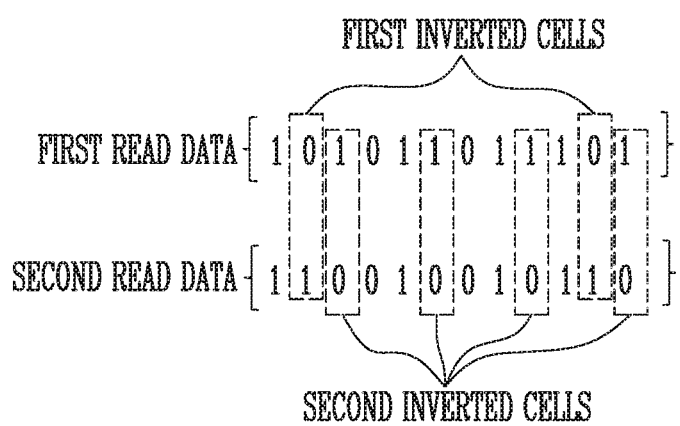
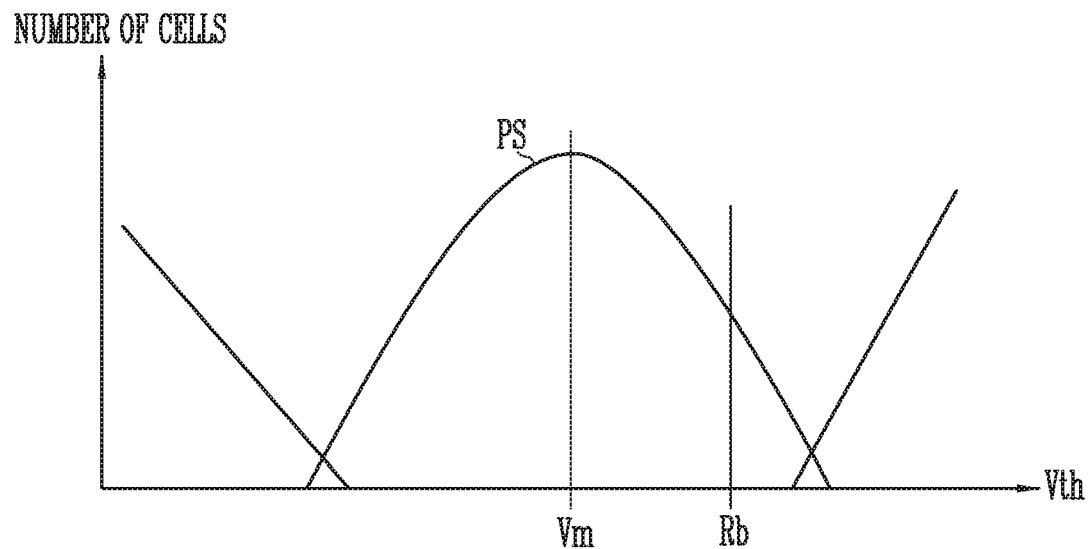

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2019-0051786, filed on May 2, 2019, which is incorporated herein by reference in its entirety.

BACKGROUND

Field of Invention

Various embodiments of the present disclosure generally relate to a memory controller and a method of operating the memory controller, and more particularly, to a memory controller for performing a read operation while changing a read voltage, and a method of operating the memory controller.

Description of Related Art

A memory system may include a memory device and a memory controller.

The memory controller may control an operation of the memory device in response to a request received from a host. The memory device may store data or output stored data under the control of the memory controller. For example, the memory device may be implemented as a volatile memory device in which stored data is lost when the supply of power is interrupted or as a nonvolatile memory device in which stored data is retained even when the supply of power is interrupted.

SUMMARY

Various embodiments of the present disclosure are directed to a memory controller for performing a read operation while changing a read voltage, and a method of operating the memory controller.

Furthermore, various embodiments are directed to a memory controller that may efficiently perform a read operation for finding an optimal read voltage and to a method of operating the memory controller.

An embodiment of the present disclosure may provide for a memory controller. The memory controller may include a command generator configured to generate first and second read commands and output the first and second read commands to a memory device so that respective first and second read operations are performed on target memory cells of the memory device using a first read voltage, a calculator configured to receive first read data and second read data in response to the first and second read commands, compare the first read data with the second read data, and calculate a number of first inverted cells and a number of second inverted cells based on a result of the compare operation, each of the first inverted cells having a bit value that inverted from a first bit value in the first read data to a second bit value in the second read data, and each of the second inverted cells having a bit value that inverted from the second bit value in the first read data to the first bit value in the second read data, and a read voltage determiner configured to change the first read voltage depending on the number of first inverted cells and the number of second inverted cells.

An embodiment of the present disclosure may provide for a memory controller. The memory controller may include an error correction decoder configured to perform an error correction decoding on first read data corresponding to a first read operation performed on target memory cells, a command generator configured to, when it is determined that the error correction decoding performed on the first read data fails, generate a read command and output the read command to a memory device so that a second read operation is performed on the target memory cells using a second read voltage that is the same as a first read voltage used for the first read operation, a calculator configured to receive second read data in response to the read command, compare the first read data with the second read data, and calculate a number of first inverted cells and a number of second inverted cells based on a result of the compare operation, each of the first inverted cells having a bit value that inverted from a first bit value in the first data to a second bit value in the second read data, and each of the second inverted cells having a bit value that inverted from the second bit value in the first read data to the first bit value in the second read data, and a read voltage determiner configured to change the first read voltage depending on the number of first inverted cells and the number of second inverted cells.

An embodiment of the present disclosure may provide for a method of operating a memory controller. The method may include receiving first read data corresponding to a first read operation performed on target memory cells using a first read voltage, receiving second read data corresponding to a second read operation performed on the target memory cells using a second read voltage, wherein the second read voltage is the same as the first read voltage, comparing the first read data with the second read data, calculating a number of first inverted cells and the number of second inverted cells based on a result of the comparing operation, each of the first inverted cells having a bit value that inverted from a first bit value in the first read data to a second bit value in the second read data, and each of the second inverted cells having a bit value that inverted from the second bit value in the first read data to the first bit value in the second read data, changing the first read voltage depending on the number of first inverted cells and the number of second inverted cells.

An embodiment of the present disclosure may provide for a memory system. The memory system may include a memory device including plurality of memory cells, and a controller suitable for sequentially performing first and second read operations on target memory cells among the plurality of memory cells using a set read voltage, receiving first read data and second read data in response to the first and second read operations, respectively, comparing the first read data with the second read data, determining the number of bit pairs which bit in the first read data has a different value than that of the corresponding bit in the second read data, and adjusting the set read voltage based on a result of the determining operation.

BRIEF DESCRIPTION OF THE DRAWINGS

FIGS. 8 and 9 are diagrams illustrating the number of inverted cells depending on a read voltage.

DETAILED DESCRIPTION

The specific structural and functional description provided herein is for the purpose of describing embodiments of the present invention. The present invention can be implemented in various forms and ways, and thus is not limited to the embodiments set forth herein. Throughout the specification, reference to "an embodiment," "another embodiment" or the like is not necessarily to only one embodiment, and different references to any such phrase are not necessarily to the same embodiment(s).

Figure 1:
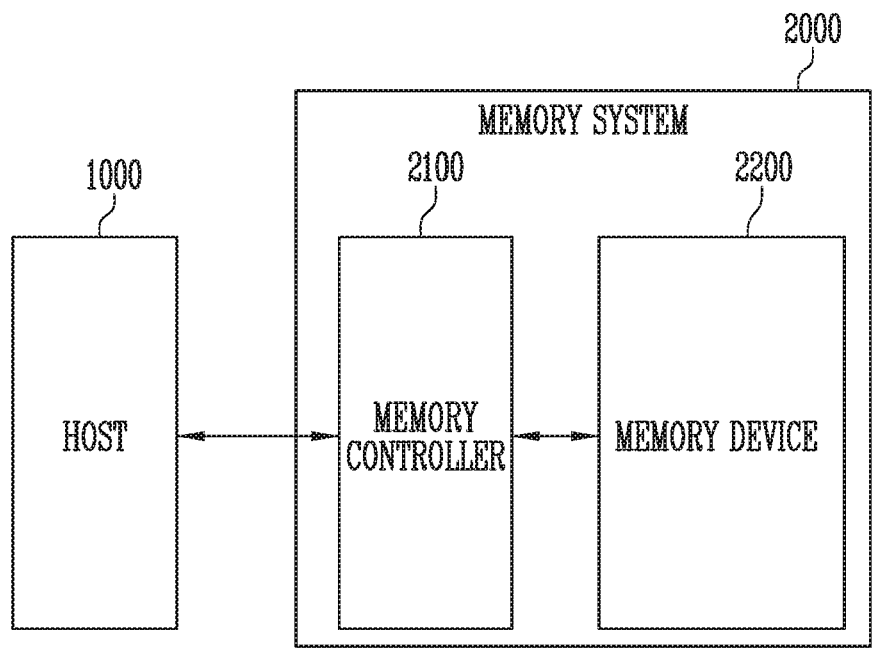
FIG. 1 is a diagram illustrating a memory system according to an embodiment of the present disclosure.

FIG. 1 is a diagram illustrating a memory system 2000 according to an embodiment of the present disclosure.

Referring to FIG. 1, the memory system 2000 may include a memory controller 2100 and a memory device 2200 which stores data. The memory controller 2100 controls the memory device 2200 in response to a request received from a host 1000.

The host 1000 may be a device or a system which stores data in the memory system 2000 or which retrieves data from the memory system 2000. For example, the host 1000 may include at least one of a computer, a portable digital device, a tablet, a digital camera, a digital audio player, a television, a wireless communication device, or a cellular phone, but embodiments of the present disclosure are not limited thereto.

The memory controller 2100 may control the overall operation of the memory system 2000. The memory controller 2100 may perform various operations in response to requests received from the host 1000. For example, the memory controller 2100 may perform a program operation, a read operation, and an erase operation on the memory device 2200. During a program operation, the memory controller 2100 may transmit a program command, an address, and data to the memory device 2200. During a read operation, the memory controller 2100 may transmit a read command, and an address to the memory device 2200, and may receive read data from the memory device 2200. During an erase operation, the memory controller 2100 may transmit an erase command, and an address to the memory device 2200.

The memory device 2200 may perform the program operation, the read operation, and the erase operation under the control of the memory controller 2100. The memory device 2200 may be implemented as a volatile memory device in which stored data is lost when the supply of power is interrupted or as a nonvolatile memory device in which stored data is retained even when the supply of power is interrupted.

The memory device 2200 may receive the program command, the address, and the data from the memory controller 2100, and may store the data in response to the received program command and address. The memory device 2200 may perform a read operation in response to the read command and the address received from the memory controller 2100, and may provide read data to the memory controller 2100. The memory device 2200 may perform an erase operation in response to the erase command and the address received from the memory controller 2100.

The memory device 2200 may include at least one memory block which stores data. The memory block may include a plurality of memory cells. A memory block may be a single-level cell (SLC) block or an m-bit multi-level cell (MLC) block depending on the number of bits that can be stored in each memory cell of that memory block. In each SLC in the SLC block, one bit of data may be stored. In each m-bit MLC in the m-bit MLC block, m bits of data may be stored. Here, m may be a natural number of 2 or more.

Figure 2:
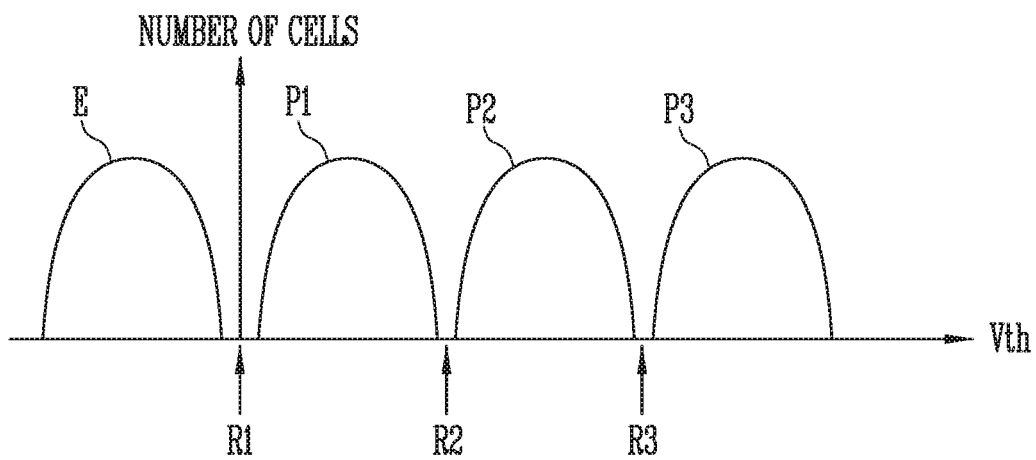
FIG. 2 is a diagram illustrating threshold voltage distributions of memory cells.

FIG. 2 is a diagram illustrating threshold voltage distributions of memory cells.

Although the threshold voltage distributions of memory cells of a 2-bit MLC type are illustrated in FIG. 2 by way of example, embodiments of the present disclosure are not limited thereto. In FIG. 2, a horizontal axis indicates the threshold voltages Vth of memory cells, and a vertical axis indicates the number of memory cells corresponding to each threshold voltage Vth.

Each 2-bit MLC may have a threshold voltage corresponding to any one of an erase state, a first program state, a second program state, and a third program state.

In an ideal case, threshold voltage distributions corresponding to a plurality of states may not overlap each other. For example, immediately after a program operation has been performed on memory cells, a threshold voltage distribution E corresponding to the erase state, a threshold voltage distribution P1 corresponding to the first program state, a threshold voltage distribution P2 corresponding to the second program state, and a threshold voltage distribution P3 corresponding to the third program state may not overlap each other.

During a read operation, the read operation may be performed on memory cells using read voltages R1, R2, and R3. The read voltage R1 may be used to distinguish memory cells corresponding to the erase state from memory cells corresponding to the first program state, the read voltage R2 may be used to distinguish the memory cells corresponding to the first program state from memory cells corresponding to the second program state, and the read voltage R3 may be used to distinguish the memory cells corresponding to the second program state from memory cells corresponding to the third program state.

Figure 3:
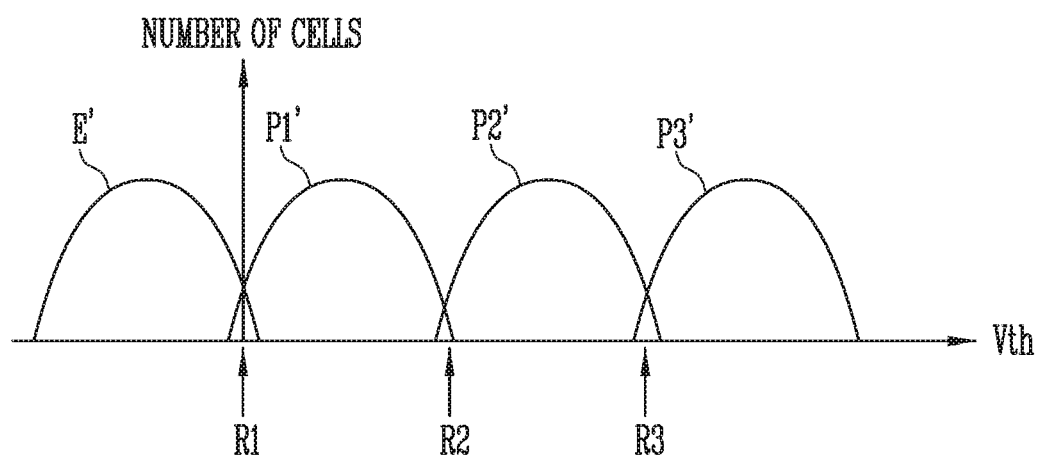
FIG. 3 is a diagram illustrating threshold voltage distributions of memory cells, the characteristics of which have changed.

FIG. 3 is a diagram illustrating threshold voltage distributions of memory cells, the characteristics of which have changed.

When the characteristics of memory cells have changed, the threshold voltage distributions of the memory cells may change. For example, the threshold voltage distribution E corresponding to the erase state of FIG. 2 may change to a threshold voltage distribution E of FIG. 3, and the threshold voltage distributions P1, P2, and P3 corresponding to the programmed states of FIG. 2 may respectively change to threshold voltage distributions P1', P2', and P3' of FIG. 3.

For example, the characteristics of the memory cells may be related to at least one of a program/erase cycle (P/E cycle) or a retention time. The program/erase (PIE) cycle may refer to the number of program operations and erase operations that are performed on memory cells. The retention time may refer to a time elapsed since the program operation performed on the memory cells.

Referring to FIG. 3, it can be seen that adjacent threshold voltage distributions overlap each other. That is, E' overlaps P1' which also overlaps P2' which also overlaps P3'.

When a read operation is performed using read voltages R1, R2, and R3 in a state in which the characteristics of memory cells have changed, as illustrated in FIG. 3, a large number of error bits may be present in read data. If the number of error bits in the read data exceeds the maximum allowable number of error bits that can be corrected by an error correction circuit, error correction decoding may fail.

Figure 4:
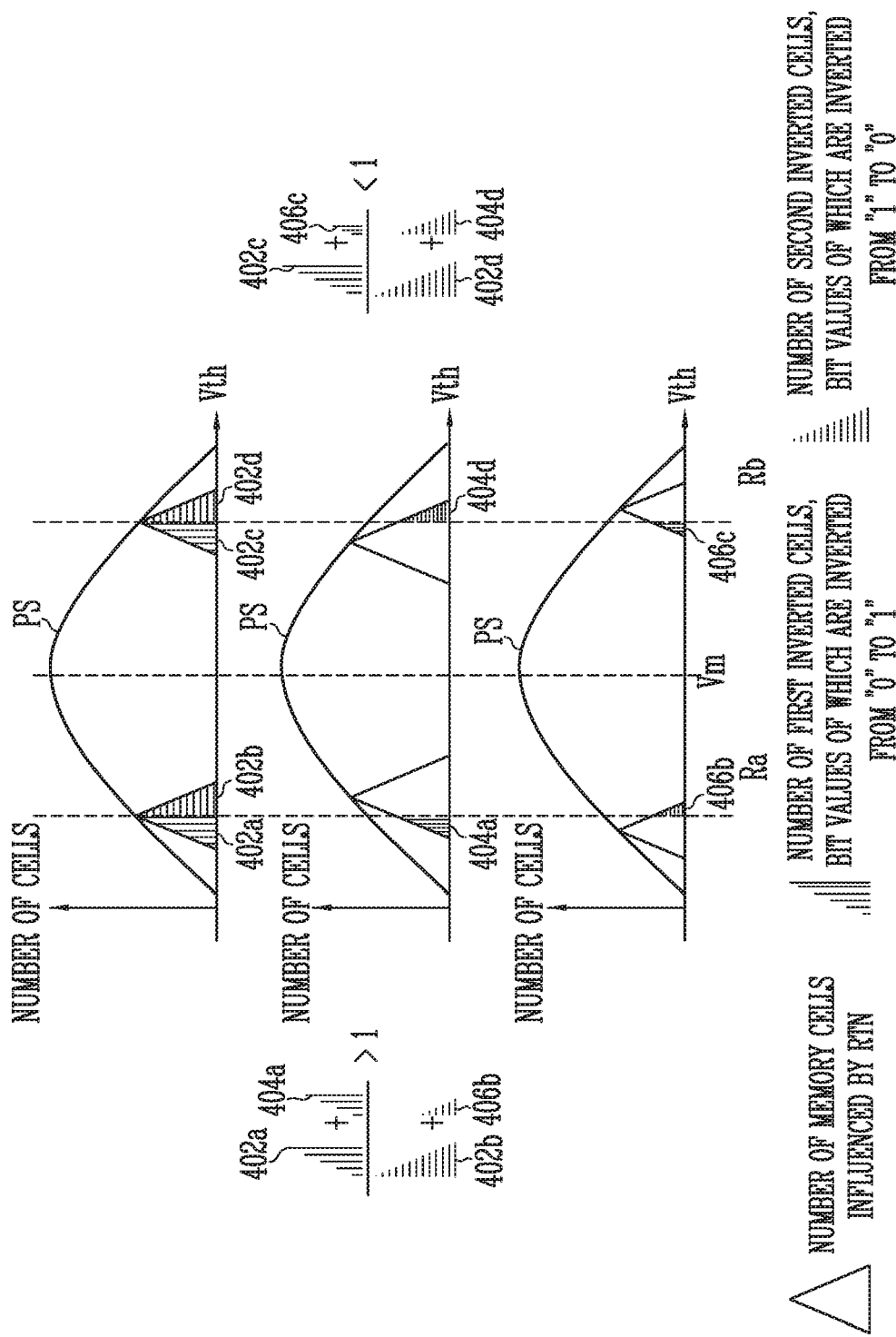
FIG. 4 is a diagram illustrating random telegraph noise (RTN).

FIG. 4 is a diagram illustrating random telegraph noise (RTN).

Threshold voltage distributions PS of memory cells having a predetermined program state are illustrated in FIG. 4.

During a read operation, memory cells having threshold voltages greater than a read voltage may each indicate a first bit value (e.g., '0'), and memory cells having threshold voltages less than the read voltage may each indicate a second bit value (e.g., '1').

During a read operation, random telegraph noise (RTN) may occur as electrons are trapped in or detrapped from the memory cells. RTN may act as the factor of the change in the threshold voltages of memory cells, so that, whenever a read operation is performed on memory cells, the threshold voltages of the memory cells may be detected as different values due to RTN, and thus bit values indicated by the memory cells may vary. For example, assuming that first and second read operations are performed on memory cells using the same read voltage, a memory cell indicating a first bit value in the first read operation may indicate a second bit value in the second read operation, and a memory cell indicating the second bit value in the first read operation may indicate the first bit value in the second read operation. That is, during a plurality of read operations using the same read voltage, a bit value indicated by the corresponding memory cell may be inverted due to RTN. Hereinafter, a memory cell that indicates the first bit value in the first read operation but indicates the second bit value in the second read operation is designated as a first inverted cell, and a memory cell that indicates the second bit value in the first read operation but indicates the first bit value in the second read operation is designated as a second inverted cell.

In particular, memory cells having threshold voltages closer to a read voltage may be further influenced by RTN, and thus it may be considered that there is a strong possibility that the bit values of memory cells having threshold voltages closer to the read voltage will be inverted.

The number of first inverted cells and the number of second inverted cells may change depending on whether the read voltage is lower or higher than a mean threshold voltage Vm in a threshold voltage distribution.

It is assumed that the first and second read operations are performed using a read voltage Ra lower than the mean threshold voltage Vm. In this case, the number of first inverted cells 402a and the number of second inverted cells 402b, among memory cells having threshold voltages equal to the read voltage Ra, may be equal to each other. The number of first inverted cells 404a, among the memory cells having threshold voltages higher than the read voltage Ra, may be greater than the number of second inverted cells 406b, among memory cells having threshold voltages lower than the read voltage Ra. The reason for this is that the number of memory cells influenced by RTN is proportional to the number of memory cells having a set threshold voltage. That is, when the read voltage Ra is lower than the mean threshold voltage Vm, the number of memory cells having threshold voltages higher than the read voltage Ra may be greater than the number of memory cells having threshold voltages lower than the read voltage Ra, and thus the number of first inverted cells 404a may be greater than the number of second inverted cells 406b.

Consequently, during the first and second read operations using the read voltage Ra, the total number of first inverted cells (402a+404a) may be greater than the total number of second inverted cells (402b+406b).

In contrast, it is assumed that first and second read operations are performed using a read voltage Rb higher than the mean threshold voltage Vm. On the same principle as that when the read voltage Ra is used, the total number of first inverted cells (402c+406c) may be less than the total number of second inverted cells (402d+404d).

Figure 5:
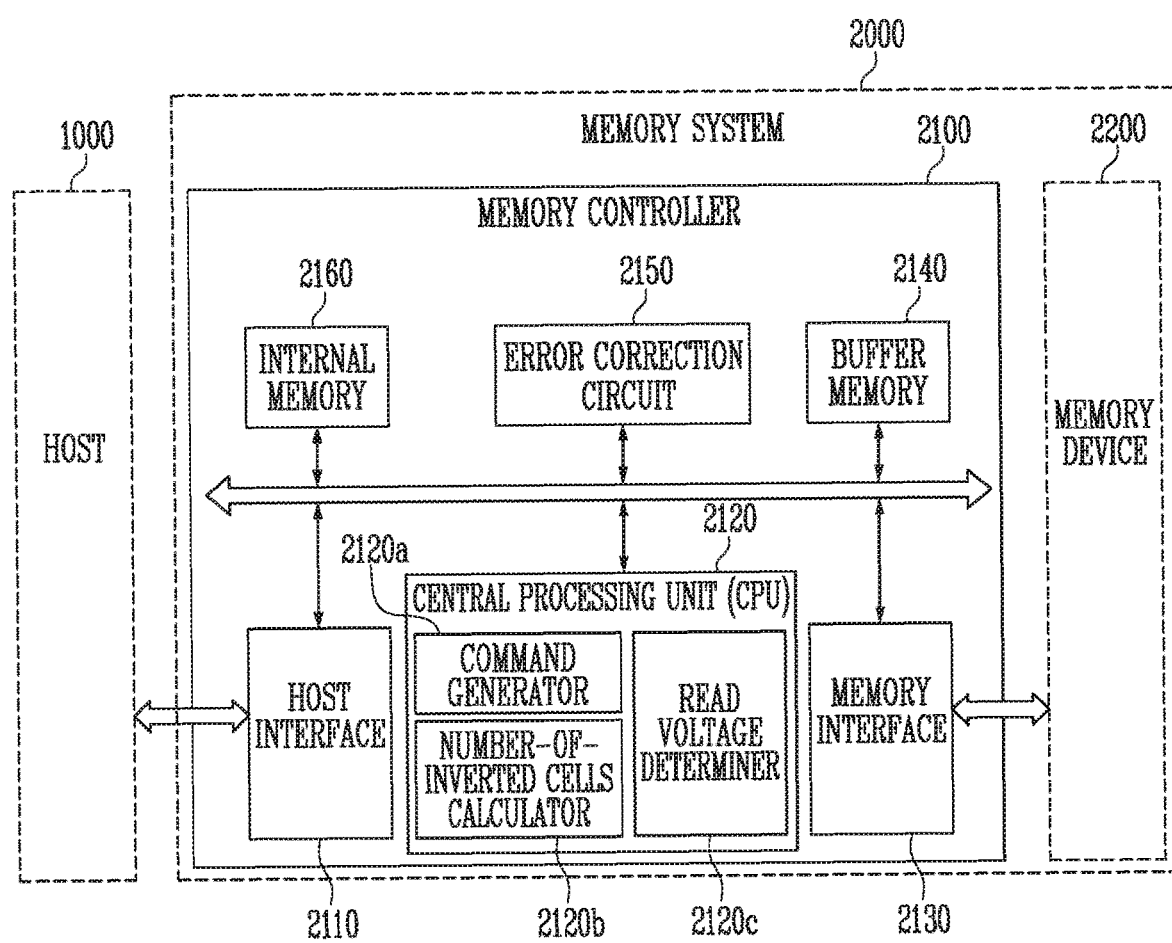
FIG. 5 is a diagram illustrating a memory controller illustrated in FIG. 1.

FIG. 5 is a diagram illustrating a memory controller 2100 illustrated in FIG. 1.

Referring to FIG. 5, the memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may communicate with the host 1000 using various interface protocols. For example, the host interface 2110 may communicate with the host 1000 using at least one of interface protocols, such as Non-Volatile Memory express (NVMe), Peripheral Component Interconnect-Express (PCI-e or PCIe), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer System Interface (SCSI), or serial attached SCSI (SAS), but embodiments of the present disclosure are not limited thereto.

The CPU 2120 may perform various types of calculations (or operations) or generate commands and addresses so as to control the memory device 2200. For example, the CPU 2120 may generate various commands and addresses required for a program operation, a read operation, and an erase operation in response to requests received from the host 1000.

The CPU 2120 may translate logical addresses, received from the host 1000, into physical addresses so as to control the operation of the memory device 2200. The CPU 2120 may translate logical addresses into physical addresses or translate physical addresses into logical addresses by utilizing an address mapping table stored in the internal memory 2160. The CPU 2120 may update the address mapping table when new data is programmed to the memory device 2200 or when data stored in the memory device 2200 is erased.

The CPU 2120 may randomize data or derandomize randomized data. During a program operation, the CPU 2120 may randomize data received from the host 1000, and may control the memory interface 2130 so that the randomized data can be transmitted to the memory device 2200. During a read operation, the CPU 2120 may derandomize the read data received from the memory device 2200, and may control the host interface 2110 so that the derandomized read data can be transmitted to the host 1000.

The CPU 2120 may include a command generator 2120a, a number-of-inverted cells calculator 2120b, and a read voltage determiner 2120c.

The command generator 2120a may generate a read command and transmit the read command to the memory device 2200 so that the memory device 2200 is capable of performing a read operation on target memory cells. The command generator 2120a may generate a first read command and transmit the first read command to the memory device 2200 so that the memory device 2200 is capable of performing a first read operation using a first read voltage.

The command generator 2120a may generate a second read command and transmit the second read command to the memory device 2200 so that the memory device 2200 is capable of performing a second read operation using a second read voltage. Here, the first read voltage and the second read voltage may be the same. That is, the memory device 2200 may perform a read operation twice using the same read voltage.

Hereinafter, the first read operation may be performed first on the target memory cells using a set read voltage, and the second read operation may be performed second on the target memory cells using the same set read voltage.

In an embodiment, when error correction decoding on first read data corresponding to the first read command fails, the command generator 2120a may generate the second read command and transmit the second read command to the memory device 2200.

The number-of-inverted cells calculator 2120b may receive the first read data corresponding to the first read command and second read data corresponding to the second read command.

In an embodiment, the number-of-inverted cells calculator 2120b may receive the second read data when error correction decoding on the first read data fails.

The number-of-inverted cells calculator 2120b may check inverted cells by comparing the first read data with the second read data. Each of the inverted cells may be a memory cell indicating different bit values in the first read data and the second read data. An inverted cell which indicates a first bit value in the first read data but indicates a second bit value in the second read data is denoted a first inverted cell, whereas an inverted cell which indicates a second bit value in the first read data but indicates a first bit value in the second read data is denoted a second inverted cell. Here, the first bit value may be '0', and the second bit value may be '1'. This convention may be reversed in another embodiment.

The number-of-inverted cells calculator 2120b may calculate the number of first inverted cells and the number of second inverted cells, and may provide information about the number of inverted cells to the read voltage determiner 2120c. The information about the number of inverted cells may include information about the number of first inverted cells and information about the number of second inverted cells.

The read voltage determiner 2120c may set or change read voltages based on the information about the number of inverted cells, received from the number-of-inverted cells calculator 2120b.

In an embodiment, when the number of first inverted cells is greater than the number of second inverted cells, the read voltage determiner 2120c may change the first read voltage to a lower voltage. Here, as the difference between the number of first inverted cells and the number of second inverted cells increases, the read voltage determiner 2120c may further decrease the first read voltage. That is, the read voltage determiner 2120c may decrease the first read voltage in proportion to the difference between the number of first inverted cells and the number of second inverted cells. In an embodiment, the read voltage determiner 2120c may decrease the first read voltage by a set value, regardless of the difference between the number of first inverted cells and the number of second inverted cells.

In an embodiment, when the number of first inverted cells is less than the number of second inverted cells, the read voltage determiner 2120c may increase the first read voltage. Here, as the difference between the number of first inverted cells and the number of second inverted cells increases, the read voltage determiner 2120c may further increase the first read voltage. In an embodiment, the read voltage determiner 2120c may also increase the first read voltage by a set value, regardless of the difference between the number of first inverted cells and the number of second inverted cells.

The read voltage determiner 2120c may provide information about the changed first read voltage to the command generator 2120a. Accordingly, the command generator 2120a may generate a command and an address and provide the command and the address to the memory device 2200 so that at least one of the first read operation and the second read operation is performed on the target memory cells using the changed first read voltage.

When error correction decoding on the first read data corresponding to the first read operation using the changed first read voltage passes, the read voltage determiner 2120c may determine the changed first read voltage to be an optimal read voltage for the target memory cells.

The memory interface 2130 may communicate with the memory device 2200 using various interface protocols.

The buffer memory 2140 may temporarily store data while the memory controller 2100 controls the memory device 2200. For example, data received from the host 1000 may be temporarily stored in the buffer memory 2140 until a program operation is completed. Further, during a read operation, read data received from the memory device 2200 may also be temporarily stored in the buffer memory 2140.

The error correction circuit 2150 may perform error correction encoding during a program operation, and may performerror correction decoding during a read operation. When error correction decoding is performed, at least one of hard decision decoding and soft decision decoding may be performed. For example, the error correction circuit 2150 may perform error correction decoding using at least one of a Bose Chaudhuri, Hocquenghem (BCH) code and a Low Density Parity Check (LDDC) code, but embodiments of the present disclosure are not limited thereto.

The error correction circuit 2150 may perform error correction encoding on program data, and may perform error correction decoding on read data. The error correction circuit 2150 may have error correction capability up to a certain number of error bits. For example, when the number of error bits in the read data does not exceed the error correction capability, the error correction circuit 2150 may detect and correct the error(s) in the read data. The error correction capability of the error correction circuit 2150 may be regarded as the maximum allowable number of error bits. When the number of error bits in the read data exceeds the maximum allowable number of error bits, error correction decoding may fail.

The error correction circuit 2150 may performerror correction decoding on the first read data. After that, the error correction circuit 2150 may notify the CPU 2120 that error correction decoding has passed or failed. Accordingly, when error correction decoding on the first read data passes, the CPU 2120 may transmit a decoded codeword to the host 1000, whereas when error correction decoding fails, the CPU 2120 may control the memory device 2200 so that the second read operation is performed.

The internal memory 2160 may be used as a storage which stores various types of information for the operation of the memory controller 2100. The internal memory 2160 may store a plurality of tables. For example, the internal memory 2160 may store a mapping table for mapping between logical addresses and physical addresses.

Figure 6:
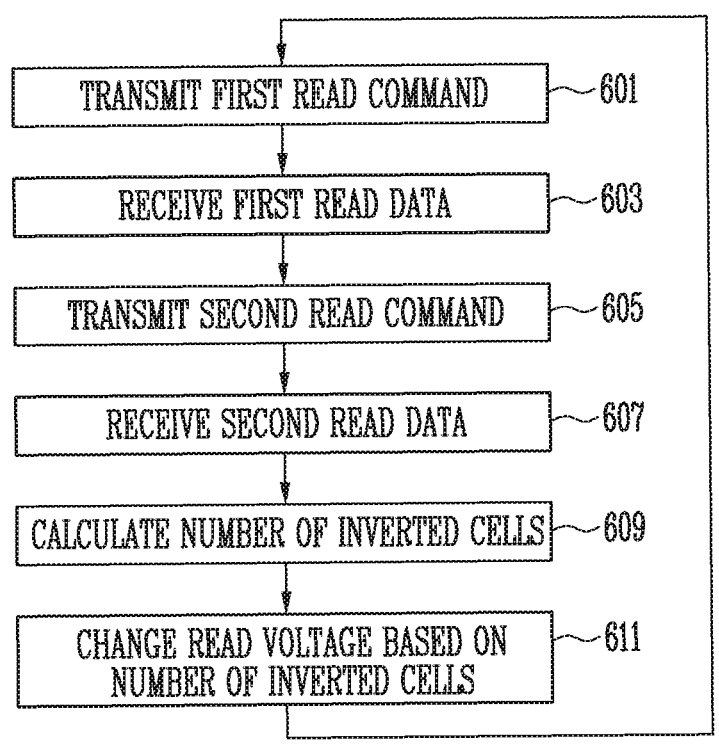
FIG. 6 is a flowchart illustrating a method of operating a memory controller according to an embodiment of the present disclosure.

FIG. 6 is a flowchart illustrating a method of operating a memory controller according to an embodiment of the present disclosure.

Referring to FIG. 6, at step 601, the memory controller may generate a first read command and transmit the first read command to the memory device so that a first read operation is performed on target memory cells. The target memory cells may be, but are not limited to, memory cells included in a single physical page. The first read command may be a command for instructing the first read operation to be performed using a first read voltage.

At step 603, the memory controller may receive first read data corresponding to the first read operation from the memory device.

At step 605, the memory controller may generate a second read command and transmit the second read command to the memory device so that a second read operation is performed on the target memory cells. The second read command may be a command for instructing the second read operation to be performed using the first read voltage. That is, the first read operation and the second read operation may be performed using the same read voltage.

At step 607, the memory controller may receive second read data corresponding to the second read operation from the memory device.

At step 609, the memory controller may calculate the number of inverted cells by comparing the first read data with the second read data. For example, the memory controller may calculate the number of first inverted cells, the bit values of which are changed from '0' to '1', and the number of second inverted cells, the bit values of which are changed from '1' to '0'.

At step 611, the memory controller may change the first read voltage based on the number of first inverted cells and the number of second inverted cells. For example, the memory controller may decrease the first read voltage when the number of first inverted cells is greater than the number of second inverted cells. For another example, the memory controller may increase the first read voltage when the number of first inverted cells is less than the number of second inverted cells. That is, whether and by how much the read voltage is changed may be determined based on the number of inverted cells. After the first read voltage is changed, the process may return to step 601. When the number of first inverted cells is equal to the number of second inverted cells, the process may be terminated without performing step 601.

Figure 7:
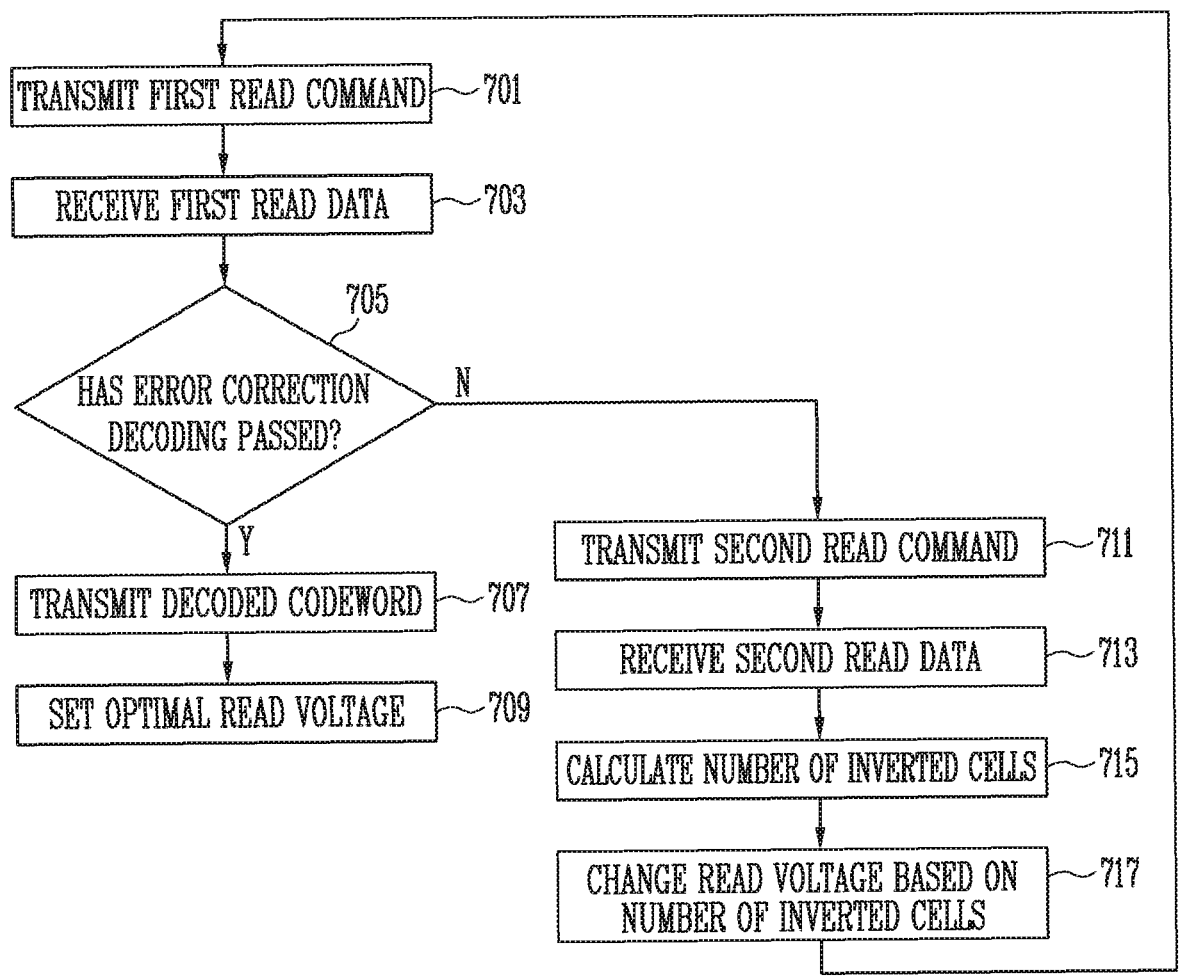
FIG. 7 is a flowchart illustrating a method of operating a memory controller according to an embodiment of the present disclosure.

FIG. 7 is a flowchart illustrating a method of operating a memory controller according to an embodiment of the present disclosure.

Referring to FIG. 7, at step 701, the memory controller may generate a first read command and transmit the first read command to the memory device so that a first read operation is performed on target memory cells. The target memory cells may be, but are not limited to, memory cells included in a single physical page. The first read command may be a command for instructing the first read operation to be performed using a first read voltage.

At step 703, the memory controller may receive first read data corresponding to the first read operation from the memory device. The first read data may be read data corresponding to a codeword.

At step 705, the memory controller may perform error correction decoding on the first read data. When errors included in the first read data are correctable, the memory controller may correct the corresponding errors, and may then generate a decoded codeword. At step 705, when error correction decoding has passed, that is, when a decoded codeword is generated ("Y" at step 705), step 707 may be performed.

At step 707, the memory controller may transmit the decoded codeword to the host.

At step 709, the memory controller may set the first read voltage as an optimal read voltage corresponding to the target memory cells.

As a result of the determination at step 705, when error correction decoding on the first read data has failed ("N" at step 705), step 711 may be performed.

At step 711, the memory controller may generate a second read command and transmit the second read command to the memory device so that a second read operation is performed on the target memory cells. The second read command may be for instructing the second read operation to be performed using the first read voltage. That is, the first read operation and the second read operation may be performed using the same read voltage.

At step 713, the memory controller may receive second read data corresponding to the second read operation from the memory device.

At step 715, the memory controller may calculate the number of inverted cells by comparing the first read data with the second read data. For example, the memory controller may calculate the number of first inverted cells, the bit values of which are changed from '0' to '1', and the number of second inverted cells, the bit values of which are changed from '1' to '0'.

At step 717, the memory controller may change the first read voltage based on the number of first inverted cells and the number of second inverted cells. The memory controller may decrease the first read voltage when the number of first inverted cells is greater than the number of second inverted cells. The memory controller may increase the first read voltage when the number of first inverted cells is less than the number of second inverted cells. When the first read voltage has changed, the process may return to step 701. At step 701, the memory controller may generate a first read command and transmit the first read command to the memory device so that the first read operation using the changed first read voltage is performed on the target memory cells.

FIGS. 8 and 9 are diagrams illustrating the number of inverted cells depending on a read voltage.

In FIG. 8, a threshold voltage distribution PS of memory cells and first read data and second read data are illustrated. The threshold voltage distribution PS of memory cells corresponds to a predetermined program state. The first read data and second read data correspond to two read operations using a read voltage Ra.

Referring to FIG. 8, it can be seen that the number of first inverted cells, the bit values of which are inverted (changed) from '0' to '1', is 4, and the number of second inverted cells, the bit values of which are inverted from '1' to '0', is 2. That is, the number of first inverted cells is greater than the number of second inverted cells. The fact that the number of first inverted cells is greater than the number of second inverted cells may mean that the read voltage Ra is lower than (i.e., located on the left side of) a mean threshold voltage Vm of the threshold voltage distribution PS. Therefore, when error correction decoding on the first read data corresponding to the read voltage Ra fails, it may be determined that the read voltage is to be decreased so as to find an optimal read voltage.

In FIG. 9, a threshold voltage distribution PS of memory cells, and first read data and second read data are illustrated. The threshold voltage distribution PS of memory cells corresponds to a set programmed state. The first read data and second read data correspond to two read operations using a read voltage Rb.

Referring to FIG. 9, it can be seen that the number of first inverted cells, the bit values of which are inverted (changed) from '0' to '1', is 2, and the number of second inverted cells, the bit values of which are inverted from '1' to '0', is 4. That is, the number of first inverted cells is less than the number of second inverted cells. The fact that the number of first inverted cells is less than the number of second inverted cells may mean that the read voltage Rb is higher than (i.e., located on the right side of) a mean threshold voltage Vm of the threshold voltage distribution PS. Therefore, when error correction decoding on the first read data corresponding to the read voltage Rb fails, it may be determined that the read voltage is to be increased so as to find an optimal read voltage.

Figure 10:
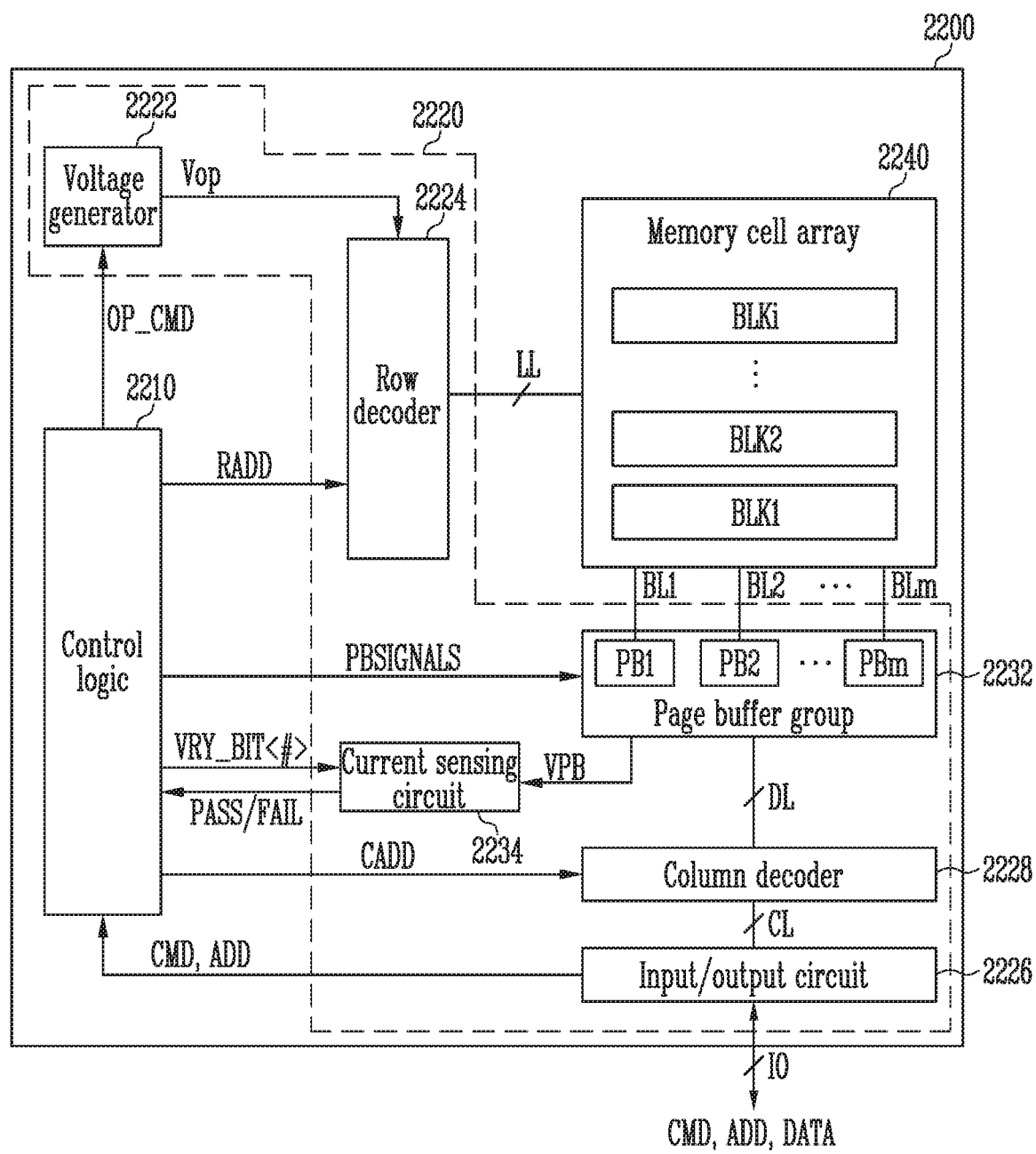
FIG. 10 is a diagram illustrating a memory device according to an embodiment of the present disclosure.

FIG. 10 is a diagram illustrating a memory device according to an embodiment of the present disclosure. The memory device illustrated in FIG. 10 may be applied to the memory system illustrated in FIGS. 1 and 5.

Referring to FIG. 10, the memory device 2200 may include control logic 2210, a peripheral circuit 2220, and a memory cell array 2240. The peripheral circuit 2220 may include a voltage generator 2222, a row decoder 2224, an input and output (input/output) circuit 2226, a column decoder 2228, a page buffer group 2232, and a current sensing circuit 2234.

The control logic 2210 may control the peripheral circuit 2220 under the control of the memory controller 2100 illustrated in FIGS. 1 and 5.

The control logic 2210 may control the peripheral circuit 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuit 2220 may perform a program operation of storing data in the memory cell array 2240, a read operation of outputting data stored in the memory cell array 2240, and an erase operation of erasing data stored in the memory cell array 2240.

The voltage generator 2222 may generate various operating voltages Vop that are used for the program, read, and erase operations in response to the operation signal OP_CMD received from the control logic 2210. For example, the voltage generator 2222 may transfer a program voltage, a verify voltage, a pass voltage, a read voltage, an erase voltage, and a turn-on voltage to the row decoder 2224.

The row decoder 2224 may transfer the operating voltages Vop to local lines LL that are coupled to a memory block selected from among memory blocks in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS received from the control logic 2210. During a program operation, the page buffers PB1 to PBm may temporarily store program data received from the memory controller, and may control voltages to be applied to the bit lines BL1 to BLm based on the program data. During a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210. Further, the current sensing circuit 2234 may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. Each of the memory blocks BLK1 to BLKi may be implemented as a two-dimensional (2D) structure or a three-dimensional (3D) structure, and may be configured the same.

Figure 11:
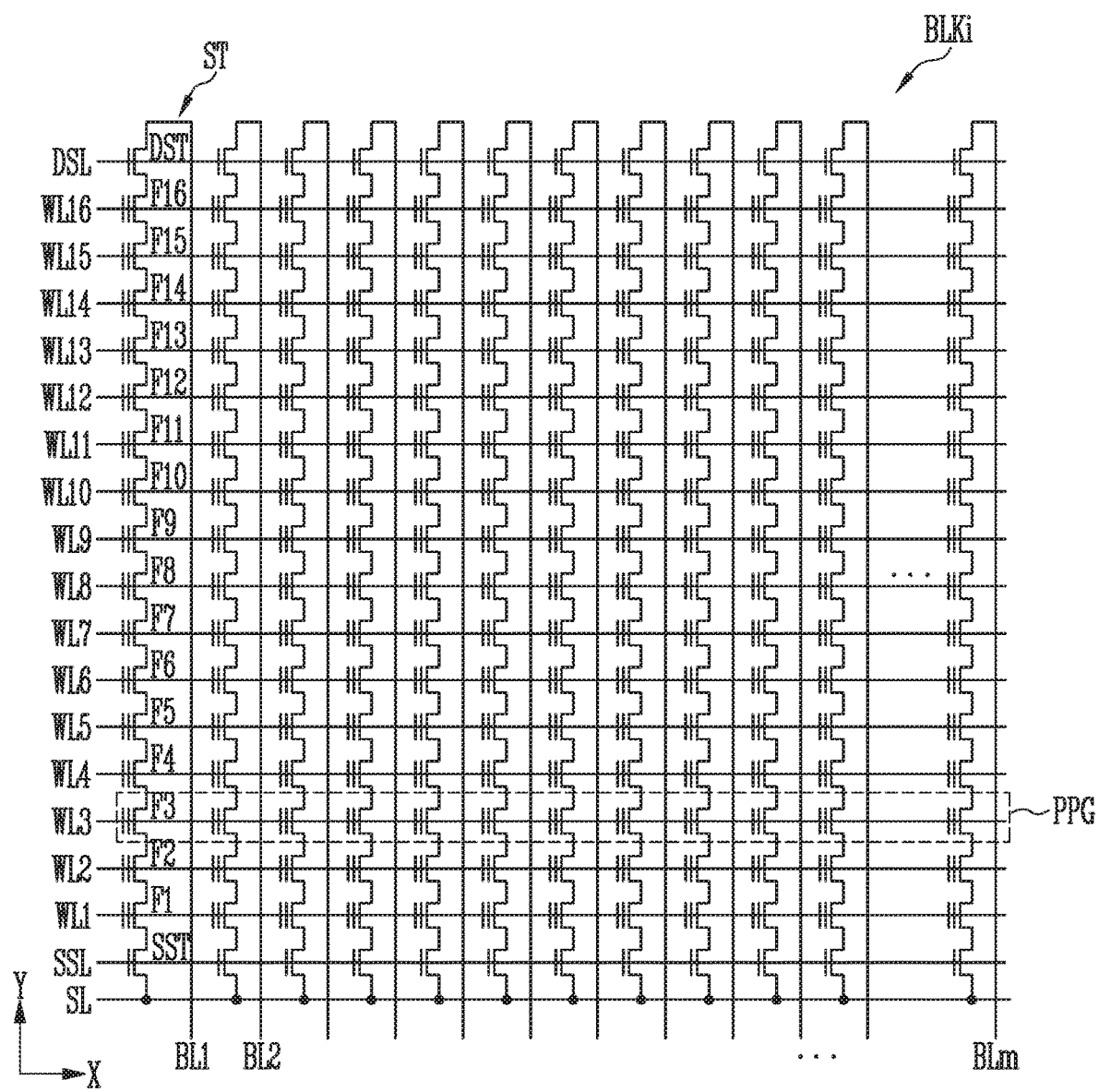
FIG. 11 is a diagram illustrating a memory block.

FIG. 11 is a diagram illustrating a memory block.

By way of example, a memory cell array may include a plurality of memory blocks, and any one memory block BLKi of the plurality of memory blocks is illustrated in FIG. 11.

A plurality of word lines arranged in parallel to each other between a first select line and a second select line may be coupled to the memory block BLKi. The first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. Each of the strings ST may be configured the same, and thus the string ST coupled to the first bit line BL1 is described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and may also include more than the 16 memory cells (F1 to F16) illustrated in the drawing.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page (PPG)". Therefore, the memory block BLKi may include the same number of physical pages PPG as the number of word lines WL1 to WL16.

Figure 12:
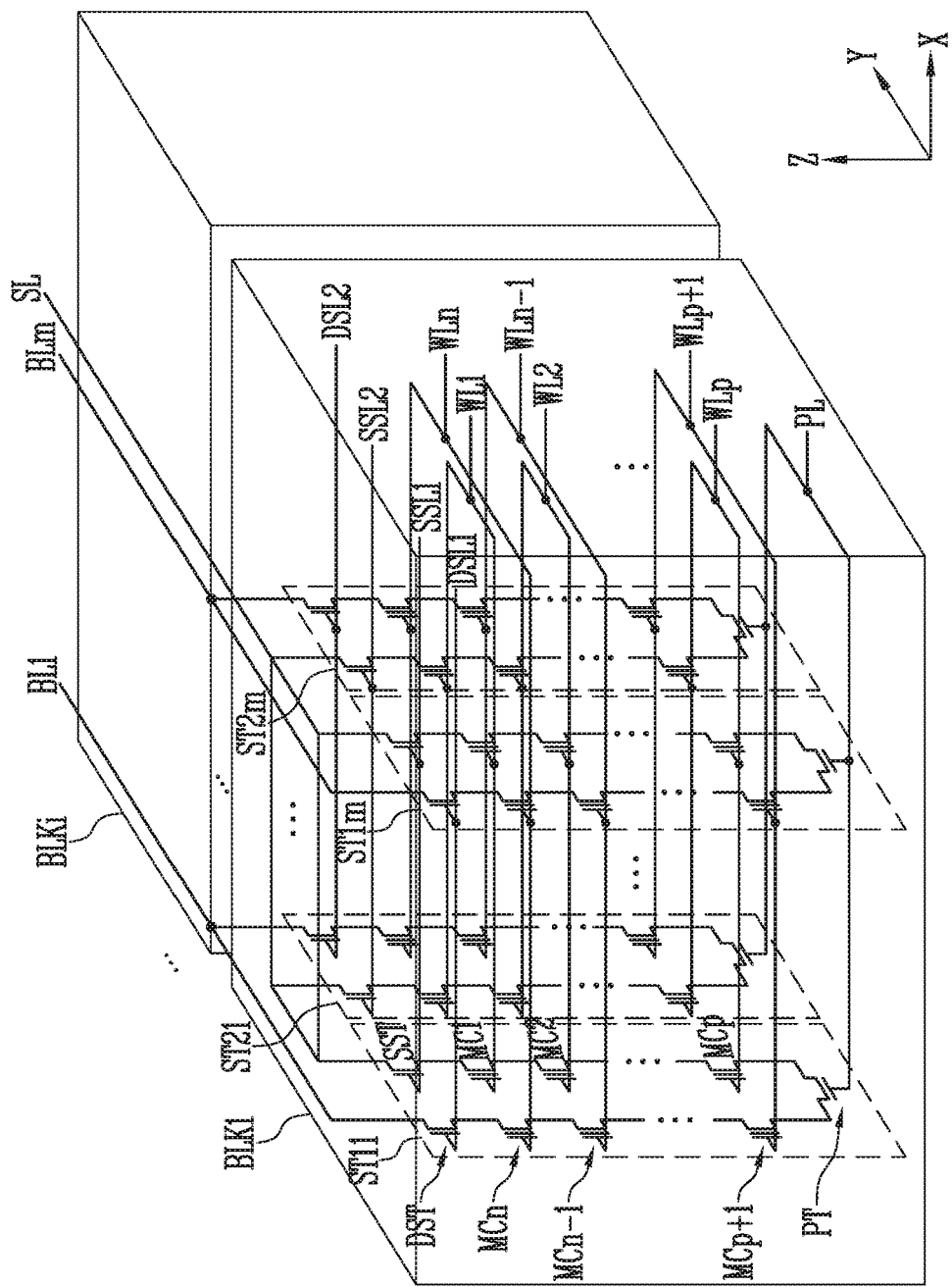
FIG. 12 is a diagram illustrating an example of a memory block having a 3D structure.

FIG. 12 is a diagram illustrating an example of a memory block having a 3D structure.

A memory cell array 2240 may include a plurality of memory blocks BLK1 to BLKi. The first memory block BLK1, described by way of example, may include a plurality of strings ST11 to ST1*m* and ST21 to ST2*m*. In an embodiment, each of the strings ST11 to ST1*m* and ST21 to ST2*m* may be formed in a 'U' shape. In the first memory block BLK1, m strings may be arranged in a row direction (e.g., X direction). Although, in the embodiment of FIG. 12, two strings are illustrated as being arranged in a column direction (e.g., Y direction), this configuration is for clarity; three or more strings may be arranged in the column direction (e.g., Y direction) in another embodiment.

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. Each of the source and drain select transistors SST and DST and the memory cells MC1 to MCn may include a channel layer, a tunnel insulating layer, a charge trap layer, and a blocking insulating layer. A pillar for providing the channel layer may be provided in each string. A pillar for providing at least one of the channel layer, the tunnel insulating layer, the charge trap layer, or the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 12, the source select transistors of the strings ST11 to ST1*m* in a first row may be coupled to a first source select line SSL1. The source select transistors of the strings ST21 to ST2*m* in a second row may be coupled to a second source select line SSL2.

In other embodiments, the source select transistors of the strings ST11 to ST1*m* and ST21 to ST2*m* may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The (p+1)-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the (p+1)-th to n-th memory cells MCp+1 to MCn may be coupled to each other through the pipe transistor PT. Gates of the first to nth memory cells MC1 to MCn in each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled.

A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1*m* in the first row may be coupled to a drain select line DSL1. The drain select transistors of the strings ST21 to ST2*m* in the second row may be coupled to a second drain select line DSL2.

The strings arranged in the column direction may be coupled to bit lines extending in the column direction. In FIG. 12, the strings ST11 and ST21 in a first column may be coupled to a first bit line BL1. The strings ST1*m* and ST2*m* in an m-th column may be coupled to an m-th bit line BLm.

Among strings arranged in the row direction, memory cells coupled to the same word line may constitute one page. Memory cells coupled to the first word line WL1, among the strings ST11 to ST1*m* in the first row, may constitute one page. Among the strings ST21 to ST2*m* in the second row, memory cells coupled to the first word line WL1 may constitute one additional page. Strings arranged in the direction of one row may be selected by selecting any one of the drain select lines DSL1 and DSL2. One page may be selected from the selected strings by selecting any one of the word lines WL1 to WLn.

Figure 13:
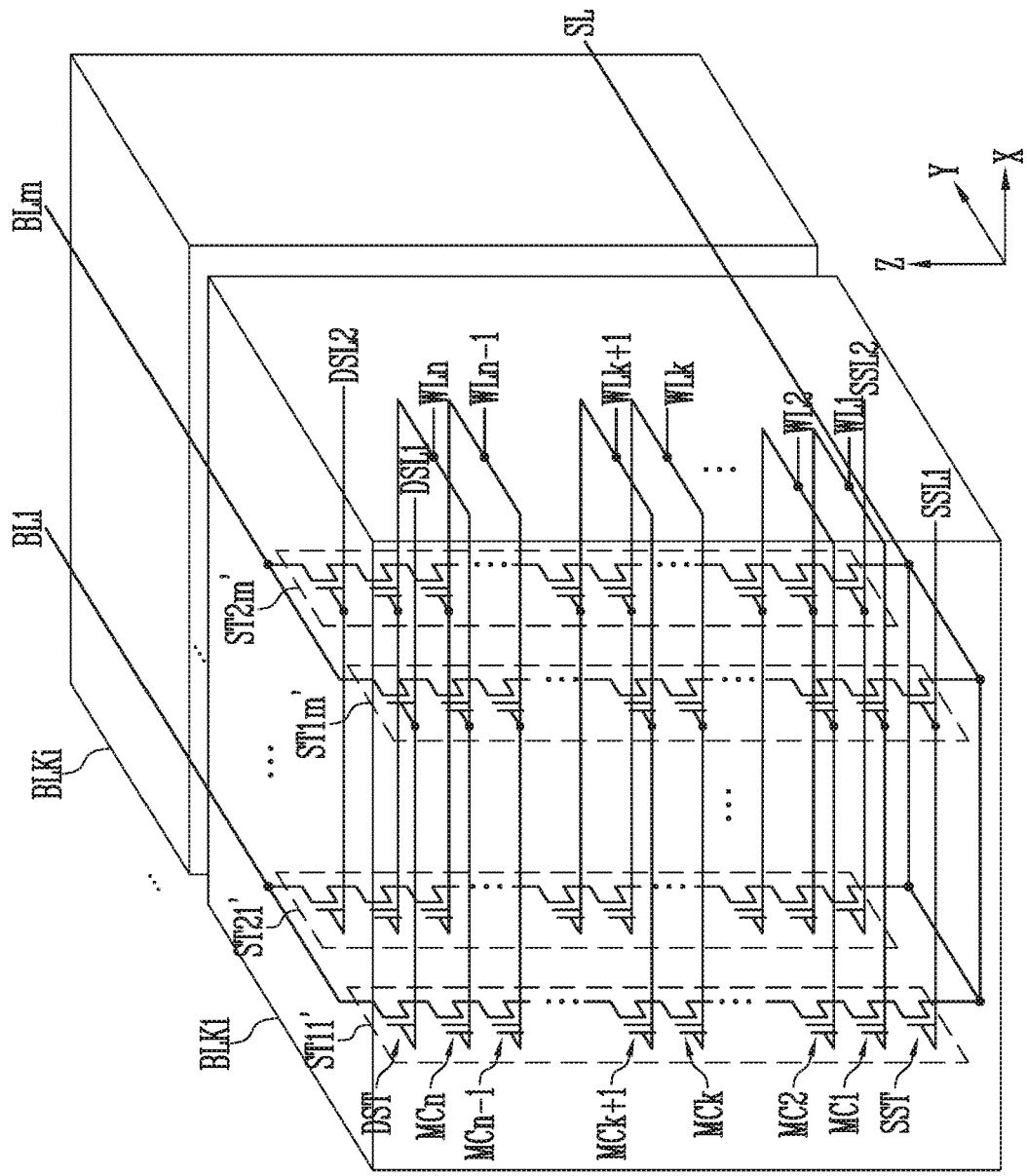
FIG. 13 is a diagram illustrating an example of a memory block having a 3D structure.

FIG. 13 is a diagram illustrating an example of a memory block having a 3D structure.

A memory cell array 2240 includes a plurality of memory blocks BLK1 to BLKi. The first memory block BLK1, described by way of example, may include a plurality of strings ST11' to ST1*m*' and ST21' to ST2*m*'. Each of the strings ST11' to ST1*m*' and ST21' to ST2*m*' may extend along a vertical direction (e.g., Z direction). In the memory block BLKi, m' strings may be arranged in a row direction (e.g., X direction). Although, in the embodiment of FIG. 13, two strings are illustrated as being arranged in a column direction Y direction), this is for clarity; three or more strings may be arranged in the column direction (e.g., Y direction) in another embodiment.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11" to ST1m" arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to one source select line.

The first to n-th memory cells MC1 to MCn in each string may be coupled in series between the source select transistor SST and the drain select transistor DST. Gates of the first to nth memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the first memory block BLK1 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

That is, the first memory block BLK1 of FIG. 13 may have an equivalent circuit similar to that of the first memory block BLK1 of FIG. 12 except that a pipe transistor PT is excluded from each string.

Figure 14:
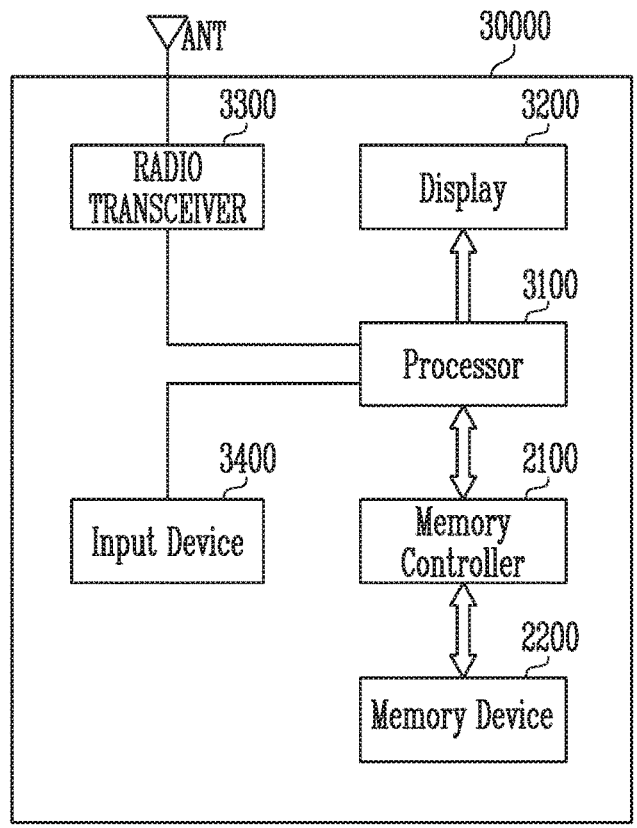
FIGS. 14 to 17 are diagrams illustrating embodiments of a memory system including the memory controller of FIGS. 1 and 5.

FIG. 14 is a diagram illustrating an embodiment of a memory system 30000 including the memory controller of FIGS. 1 and 5.

Referring to FIG. 14, the memory system 30000 may be implemented as a cellular phone, a smartphone, a tablet, a PC, a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may convert a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may convert a signal output from the processor 3100 into a radio signal, and output the radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 15:
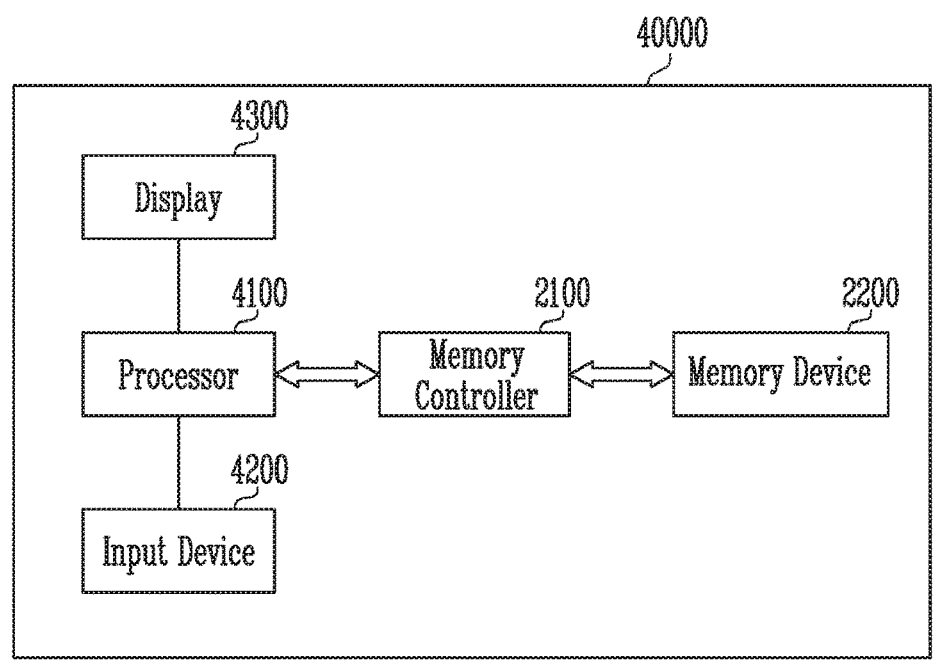

FIG. 15 is a diagram illustrating an embodiment of a memory system 40000 including the memory controller of FIGS. 1 and 5.

Referring to FIG. 15, the memory system 40000 may be embodied in a personal computer (PC), a tablet, a net-book, an e-reader, a personal digital assistant (PDA), a portable multimedia player (PMP), an MP3 player, or an MP4 player.

The memory system 40000 may include a memory device 2200 and a memory controller 2100 that is capable of controlling the data processing operation of the memory device 2200.

A processor 4100 may output data stored in the memory device 2200 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 2100. In an embodiment, the memory controller 2100 capable of controlling the operation of the memory device 2200 may be implemented as a part of the processor 4100 or as a chip provided separately from the processor 4100.

Figure 16:
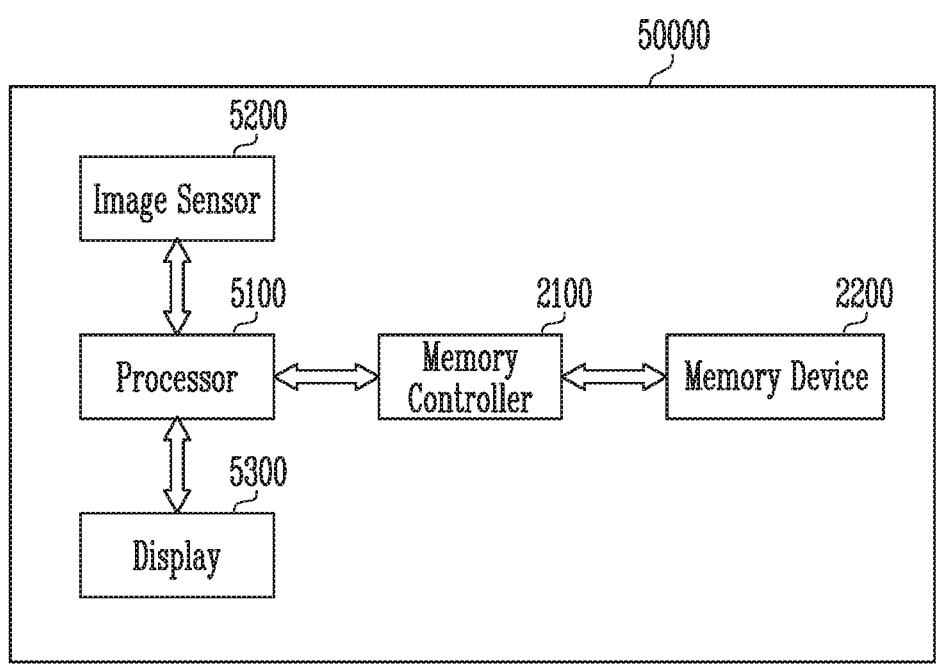

FIG. 16 is a diagram illustrating an embodiment of a memory system 50000 including the memory controller of FIGS. 1 and 5.

Referring to FIG. 16, the memory system 50000 may be embodied in an image processing device, e.g., a digital camera, a portable phone provided with a digital camera, a smartphone provided with a digital camera, or a tablet provided with a digital camera.

The memory system 50000 may include a memory device 2200 and a memory controller 2100 that is capable of controlling a data processing operation, e.g., a program, erase, or read operation, of the memory device 2200.

An image sensor 5200 of the memory system 50000 may convert an optical image into digital signals. The digital signals may be transmitted to a processor 5100 or the memory controller 2100. Under the control of the processor 5100, the digital signals may be output through a display 5300 or stored in the memory device 2200 through the memory controller 2100. Data stored in the memory device 2200 may be output through the display 5300 under the control of the processor 5100 or the memory controller 2100.

In an embodiment, the memory controller 2100 capable of controlling the operation of the memory device 2200 may be implemented as a part of the processor 5100, or as a chip provided separately from the processor 5100.

Figure 17:
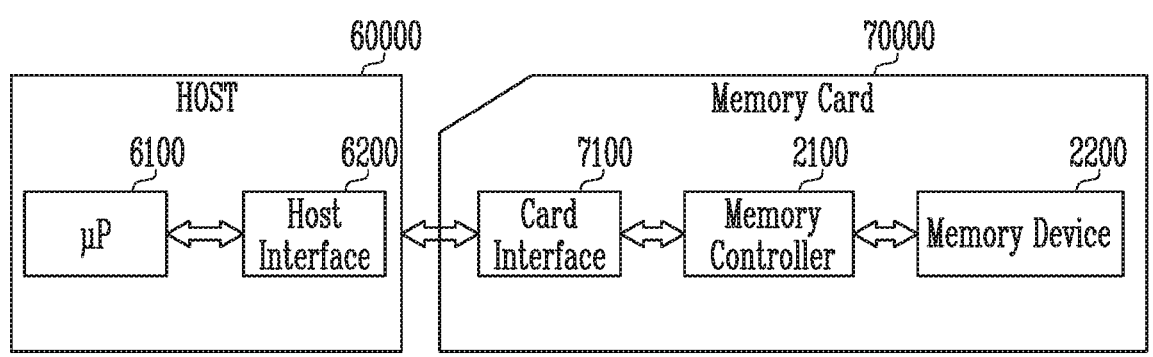

FIG. 17 is a diagram illustrating an embodiment of a memory system 70000 including the memory controller of FIGS. 1 and 5.

Referring to FIG. 17, the memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor (μP) 6100.

In accordance with embodiments of the present disclosure, a read operation for determining an optimal read voltage may be efficiently performed.

While the present invention has been illustrated and described in connection with various embodiments, the present invention is not limited to any particular embodiment(s) nor to specific details. As those skilled in the art will understand in light of the present disclosure, various modifications may be made to any of the disclosed embodiments without departing from the spirit and scope of the present invention. Thus, the present invention encompasses all such modifications to the extent that they fall within the scope of the claims and their equivalents.

What is claimed is:

1. A memory controller, comprising:
   a command generator configured to generate first and second read commands and output the first and second read commands to a memory device so that respective first and second read operations are performed on target memory cells of the memory device using a first read voltage;
   a calculator configured to receive first read data and second read data in response to the first and second read commands, compare the first read data with the second read data, and calculate a number of first inverted cells and a number of second inverted cells based on a result of the compare operation, each of the first inverted cells having a bit value that inverted from a first bit value in the first read data to a second bit value in the second read data, and each of the second inverted cells having a bit value that inverted from the second bit value in the first read data to the first bit value in the second read data; and
   a read voltage determiner configured to change the first read voltage depending on the number of first inverted cells and the number of second inverted cells.

2. The memory controller according to claim 1, wherein the read voltage determiner is configured to decrease the first read voltage when it is determined that the number of first inverted cells is greater than the number of second inverted cells.

3. The memory controller according to claim 1, wherein the read voltage determiner is configured to increase the first read voltage when it is determined that the number of first inverted cells is less than the number of second inverted cells.

4. The memory controller according to claim 1, wherein the read voltage determiner is configured to change the first read voltage in proportion to a difference between the number of first inverted cells and the number of second inverted cells.

5. The memory controller according to claim 1, wherein the read voltage determiner is configured to change the first read voltage by a set value.

6. A memory controller, comprising:
   an error correction decoder configured to perform an error correction decoding on first read data corresponding to a first read operation performed on target memory cells;
   a command generator configured to, when it is determined that the error correction decoding performed on the first read data fails, generate a read command and output the read command to a memory device so that a second read operation is performed on the target memory cells using a second read voltage that is the same as a first read voltage used for the first read operation;
   a calculator configured to receive second read data in response to the read command, compare the first read data with the second read data, and calculate a number of first inverted cells and a number of second inverted cells based on a result of the compare operation, each of the first inverted cells having a bit value that inverted from a first bit value in the first data to a second bit value in the second read data, and each of the second inverted cells having a bit value that inverted from the second bit value in the first read data to the first bit value in the second read data; and
   a read voltage determiner configured to change the first read voltage depending on the number of first inverted cells and the number of second inverted cells.

7. The memory controller according to claim 6, wherein the command generator is configured to generate a subsequent read command and output the subsequent read command to the memory device so that a third read operation is performed on the target memory cells using the changed first read voltage.

8. The memory controller according to claim 7, wherein:
   the error correction decoder is configured to perform the error correction decoding on the third read data corresponding to the third read operation, and
   the read voltage determiner is configured to determine the changed first read voltage to be an optimal read voltage corresponding to the target memory cells when it is determined that the error correction decoding performed on the third read data is successful.

9. The memory controller according to claim 6, wherein the read voltage determiner is configured to decrease the first read voltage when it determined that the number of first inverted cells is greater than the number of second inverted cells.

10. The memory controller according to claim 6, wherein the read voltage determiner is configured to increase the first read voltage when it is determined that the number of first inverted cells is less than the number of second inverted cells.

11. The memory controller according to claim 6, wherein the read voltage determiner is configured to change the first read voltage in proportion to a difference between the number of first inverted cells and the number of second inverted cells.

12. The memory controller according to claim 6, wherein the read voltage determiner is configured to change the first read voltage by a set value.

13. A method of operating a memory controller, comprising:
receiving first read data corresponding to a first read operation performed on target memory cells using a first read voltage;
receiving second read data corresponding to a second read operation performed on the target memory cells using a second read voltage, wherein the second read voltage is the same as the first read voltage;
comparing the first read data with the second read data;
calculating a number of first inverted cells and a number of second inverted cells based on a result of the comparing operation, each of the first inverted cells having a bit value that inverted from a first bit value in the first read data to a second bit value in the second read data, and each of the second inverted cells having a bit value that inverted from the second bit value in the first read data to the first bit value in the second read data; and
changing the first read voltage depending on the number of first inverted cells and the number of second inverted cells.

14. The method according to claim 13, further comprising performing an error correction decoding on the first read data,
wherein the receiving of the second read data comprises receiving the second read data when it is determined that the error correction decoding performed on the first read data fails.

15. The method according to claim 13, further comprising:
receiving third read data corresponding to a third read operation performed on the target memory cell using the changed first read voltage;
performing an error correction decoding on the third read data; and
when it is determined that the error correction decoding on the third read data is successful, determining the changed first read voltage to be an optimal read voltage corresponding to the target memory cells.

16. The method according to claim 13, wherein the changing of the first read voltage comprises decreasing the first read voltage when it is determined that the number of first inverted cells is greater than the number of second inverted cells.

17. The method according to claim 13, wherein the changing of the first read voltage comprises increasing the first read voltage when it is determined that the number of first inverted cells is less than the number of second inverted cells.

18. The method according to claim 13, wherein the changing of the first read voltage comprises changing the first read voltage in proportion to a difference between the number of first inverted cells and the number of second inverted cells.

19. The method according to claim 13, wherein the changing of the first read voltage comprises changing the first read voltage by a set value.

* * * * *